United States Patent Office 2,950,220

Patented Aug. 23, 1960

2,950,220

PREPARATION OF P–N JUNCTIONS BY THE DECOMPOSITION OF COMPOUNDS

Milton Genser and Worth P. Allred, Columbus, Ohio, assignors, by mesne assignments, to The Battelle Development Corporation, Columbus, Ohio, a corporation of Delaware No Drawing. Filed Mar. 13, 1956, Ser. No. 571,141

4 Claims. (Cl. 148—1.5)

This invention relates to the preparation of p–n junctions in semiconductors containing a plurality of elements, such as intermetallic semiconductors.

In the past, p–n junctions have been prepared by various techniques such as by alloying, by diffusion, by double doping during crystal growth, and by variation of growth rate. In all of these methods the objective is to introduce acceptor and donor impurities in a semiconductor in such manner that one portion becomes p-type, providing conduction by holes, and an adjacent portion becomes n-type, providing conduction by electrons. A semiconductor material that has been doped to provide one type of conduction can be treated to provide the opposite type of conduction in a portion thereof, to provide a p–n junction.

In the alloying method of preparing junctions, there is melted on the surface of the crystal an element or alloy containing an element capable of doping the crystal to provide conduction of the type opposite to that provided by the original doping. The element or alloy dissolves a portion of the crystal and precipitates on the crystal when cooled. The conduction in the precipitated region is opposite to that in the rest of the crystal. Thus, a p–n junction is obtained.

In the diffusion technique the opposite type of conduction is provided in a layer of a semiconductor crystal by diffusing a suitable doping material directly into a portion of the crystal at high temperature.

In the direct growth method double doping is employed during the growth of the crystal, to prepare the junction. Variation in growth rate can be employed to provide regions of opposite conductivity, since the distribution coefficient for many doping impurities is a function of growth rate.

The present invention comprises a method of preparing a p–n junction in a semiconductor containing a plurality of elements. The method comprises heating the semiconductor in a substantially inert atmosphere until a sufficient amount of at least one of the elements in the material is dissociated from the surface of the semiconductor to reverse the type of conduction in at least a portion of the surface, and removing the dissociated material from the semiconductor.

In one form of the invention an n-type semiconductor material, such as aluminum antimonide doped with tellurium, is heated at low pressure to such a temperature that the compound is slightly decomposed on the surface. The pressure is not critical. A pressure in the order of 25 microns of mercury, which can be provided by evacuation with a rough-out pump, is satisfactory. The low pressure provide a substantially inert atmosphere and facilitates vaporization. A cool portion is provided in the evacuation chamber to condense the vaporized material at a location away from the semiconductor. The loss of the more volatile element (antimony, in aluminum antimonide) by the surface decomposition provides a high concentration of lattice vacancies near the surface. The lattice vacancies provide a p-type conduction layer on the surface of the material by increasing the hole concentration. Thus, a p–n junction is obtained.

Gallium arsenide and indium phosphide are other materials in which the action is similar to that described above in connection with aluminum antimonide, in which surface decomposition provides a p-type region. In some materials, such as znic oxide, an n-type region can be produced by surface decomposition. The loss of the more volatile element, oxygen, results in increased concentration of the more stable constituent, zinc, in interstitial positions in the crystal lattice near the surface, and thereby increases the concentration of electrons in the surface. The original doping in such materials should be such as to provide a p-type starting material.

One of the semiconductor materials with which the method of the present invention has been used is n-type aluminum antimonide doped with tellurium. A crystal slice was heated at 900° C. for 3 hours in a chamber evacuated by a rough-out pump. The material vaporized from the surface of the semiconductor was condensed at a location away from the semiconductor. Thermoelectric power measurements made with a thermoelectric probe showed that the entire surface of the semiconductor had become p-type. The p-type surface layer was removed from one side of the semiconductor by lapping. The semiconductor was irradiated by a tungsten lamp, producing a photovoltage of 0.53 volt at 530 microamperes per $cm.^2$ between the n-type region and the p-type region of the semiconductor. The depth of penetration of the p-type layer and the photovoltage vary with temperature and heating time. A wide range of temperatures and heating times can be used depending upon the desired characteristics. Selection of desired temperatures and heating times for use with various semiconductor materials is readily accomplished after routine testing.

The following table lists the photovoltages and currents obtained from p–n junctions of aluminum antimonide. The starting material was n-type aluminum antimonide and the p-type layer was provided as described in the above example, with the temperatures and times as listed in the table. Thermoelectric power measurements showed that a p–n junction had been obtained in each case.

*Table*

| Temperature, ° C. | Time | Voltage | Current micro-amperes/ $cm.^2$ |
|---|---|---|---|
| 900 | 3 hours | .53 | 530 |
| 900 | 7 hours | .38 | 27 |
| 982 | 20 minutes | .34 | 55 |
| 982 | 5 minutes | .13 | 8 |
| 800 | 26 hours | .28 | 10 |
| 800 | 15 hours | .50 | 23 |

Aluminum oxide is formed on the surface of the material, from the residual oxygen in the evacuated chamber, causing a high internal resistance within the photocell. Higher currents can be obtained by preventing the oxidation and thereby reducing the internal resistance.

The method of the present invention is particularly useful for preparing photovoltaic devices, rectifiers, transistors, and other semiconductor devices requiring p–n junctions. The method has the advantage of great simplicity, since it is not necessary to use any additional materials to provide the junction. Another advantage is the increased ease of providing p–n junctions having very large areas, as are desirable in power rectifiers and other high-power semiconductor devices.

What is claimed is:

1. A method of preparing a p–n junction in n-type aluminum antimonide, which comprises: decomposing the surface of said aluminum antimonide, and vaporizing a portion of the antimony from the decomposed aluminum antimonide causing the remaining aluminum of said compound to increase the concentration of holes in at least a portion of said surface.

2. A method of preparing a p–n junction in a semiconductor of one type of conductivity comprising predominately at least one compound of the group consisting of aluminum antimonide, gallium arsenide, indium phosphide, and zinc oxide, which comprises: heating said semiconductor in a substantially inert atmosphere to cause decomposition of one said compound and vaporization of one element of said one compound from the surface of said semiconductor causing the remaining element of said compound to reverse the type of conductivity in at least a portion of said surface; and condensing the vaporized material at a location away from said semiconductor.

3. A method according to claim 2 in which said substantially inert atmosphere comprises a partial vacuum.

4. A method of preparing a p–n junction in a semiconductor of one type of conductivity comprising predominately a compound of the group consisting of aluminum antimonide, gallium arsenide, indium phosphide, and zinc oxide, which comprises: heating said semiconductor in a substantially inert atmosphere to cause decomposition of the compound and vaporization of one element of said compound from the surface of said semiconductor causing the remaining element of said compound to reverse the type of conductivity in at least a portion of said surface; and condensing the vaporized material at a location away from said semiconductor.

References Cited in the file of this patent

UNITED STATES PATENTS

| | | |
|---|---|---|
| 2,719,253 | Willardson et al. | Sept. 27, 1955 |
| 2,725,315 | Fuller | Nov. 29, 1955 |
| 2,730,470 | Shockley | Jan. 10, 1956 |
| 2,759,861 | Collins et al. | Aug. 21, 1956 |
| 2,784,121 | Fuller | Mar. 5, 1957 |
| 2,798,989 | Welker | July 9, 1957 |
| 2,815,303 | Smith | Dec. 3, 1957 |
| 2,816,023 | Genser et al. | Dec. 10, 1957 |
| 2,845,371 | Smith | July 29, 1958 |
| 2,847,335 | Gremmelmaier et al. | Aug. 12, 1958 |
| 2,849,343 | Kroger et al. | Aug. 26, 1958 |
| 2,868,678 | Shockley | Jan. 13, 1959 |

OTHER REFERENCES

Physical Review, vol. 92, No. 6, December 1953, pages 1573–1574.